(12) United States Patent
Richter

(10) Patent No.: US 12,334,822 B2
(45) Date of Patent: Jun. 17, 2025

(54) TIMER CIRCUIT

(71) Applicant: Infineon Technologies AG, Neubiberg (DE)

(72) Inventor: Julia Richter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 244 days.

(21) Appl. No.: 18/156,510

(22) Filed: Jan. 19, 2023

(65) Prior Publication Data

US 2023/0238880 A1 Jul. 27, 2023

(30) Foreign Application Priority Data

Jan. 27, 2022 (DE) .......................... 102022101906.3

(51) Int. Cl.
*H02M 3/156* (2006.01)
*H03K 3/02* (2006.01)
*H03K 5/13* (2014.01)
*H03K 5/22* (2006.01)

(52) U.S. Cl.
CPC ............ *H02M 3/1566* (2021.05); *H03K 3/02* (2013.01); *H03K 5/13* (2013.01); *H03K 5/22* (2013.01)

(58) Field of Classification Search
CPC ......... H02M 3/1566; H03K 5/13; H03K 3/02; H03K 5/22
USPC .......... 323/271; 331/172, 34, 135, 111, 143; 327/175
See application file for complete search history.

(56) References Cited

U.S. PATENT DOCUMENTS 11,005,376 B2    5/2021   Chen
2013/0057353 A1*  3/2013   Raphaeli .............. H03K 3/0231
                                                331/108 C

OTHER PUBLICATIONS

Oct. 17, 2022 (DE) Office Action—App. 102022101906.3.

* cited by examiner

*Primary Examiner* — Arnold M Kinkead
(74) *Attorney, Agent, or Firm* — Banner & Witcoff Ltd.

(57) ABSTRACT

A timer circuit including a ramp voltage generator configured to generate a ramp voltage, a comparator coupled on its input side to the ramp voltage generator to receive the ramp voltage and configured to compare the ramp voltage with a switching threshold, and a voltage pulse generating circuit configured to generate a reset signal as a response to a received output signal of the comparator, wherein the reset signal has a shorter time duration than an intrinsic reset time duration of the comparator.

11 Claims, 3 Drawing Sheets

TIMER CIRCUIT

TECHNICAL FIELD

The disclosure relates to a timer circuit.

BACKGROUND

A reliable time base, for example an oscillator, should be defined by as few parameters as possible, which are controllable as well as possible.

In accordance with prior art illustrated schematically by way of example in FIG. 1A, a ramp voltage generator 100 (also referred to as sawtooth voltage generator) can utilize a constant-current source 104 in order to charge a capacitor 106/C1.

A voltage difference between a present voltage value vramp and a reference voltage vref can be monitored by means of a comparator 102.

If the capacitor voltage vramp having a sawtooth-like profile reaches the value of the reference value vref, the comparator 102 switches and thereby starts the discharge of the capacitor C1.

The voltage peaks that arise in the case of the comparator output voltage vpulse form a time base (or a clock signal) which is used in a system in which the timer circuit 100 is integrated.

A duration of the time base, i.e. a time interval between two of the voltage peaks, is composed (in this respect, see also FIG. 1B) of the charging duration of the capacitor 106 (that part of the ramp vramp which progresses between the lowest voltage value and the reference voltage vref), which is unavoidable, a (likewise unavoidable) switching time duration tsr of the comparator 102 after the voltage value has reached the reference value vref, the discharge duration tdis and an (undesired) reset time duration tsf of the comparator 102.

Particularly in a case of low-energy applications, the positive (i.e. forward) switching time of the comparator 102 is shorter than the reset time duration of the comparator 102.

This results in a dead time of an order of magnitude of a plurality of nanoseconds in the ramp voltage profile for this standard implementation, said dead time being dependent on the supply voltage and the process and exhibiting in particular fluctuations that are likewise in the nanoseconds range.

The time base generation using a comparator 106 in accordance with the prior art thus has the disadvantage that the switching time of the comparator 106 contributes to the dead time twice and thus contributes a parasitic and undesired portion.

SUMMARY

By virtue of the fact that in the case of a timer circuit in accordance with various exemplary embodiments, the comparator for generating the time base is utilized only once, namely for marking the beginning of the time duration, parasitic effects can be minimized since the time duration can be substantially determined by the time duration that is necessary to discharge a capacitor that is part of the timer circuit.

In various exemplary embodiments, the time base generated can be defined by means of fewer variable circuit parameters and can accordingly be more precise.

The timer circuit in accordance with various exemplary embodiments comprises an additional voltage pulse generator circuit, which generates a reset signal, the start of which is defined by the comparator and which has a time duration which is shorter than that which would naturally arise if not only the start of the reset signal but also the end of the reset signal were defined by the comparator.

To put it another way, by adding the additional voltage pulse generator circuit, an output voltage pulse which is shorter and has a lower variance than the intrinsic voltage pulse of the comparator is generated as reset signal.

BRIEF DESCRIPTION OF THE DRAWINGS

Exemplary embodiments of the disclosure are illustrated in the figures and are explained in greater detail below.

In the Figures.

DETAILED DESCRIPTION

Figure 1A:
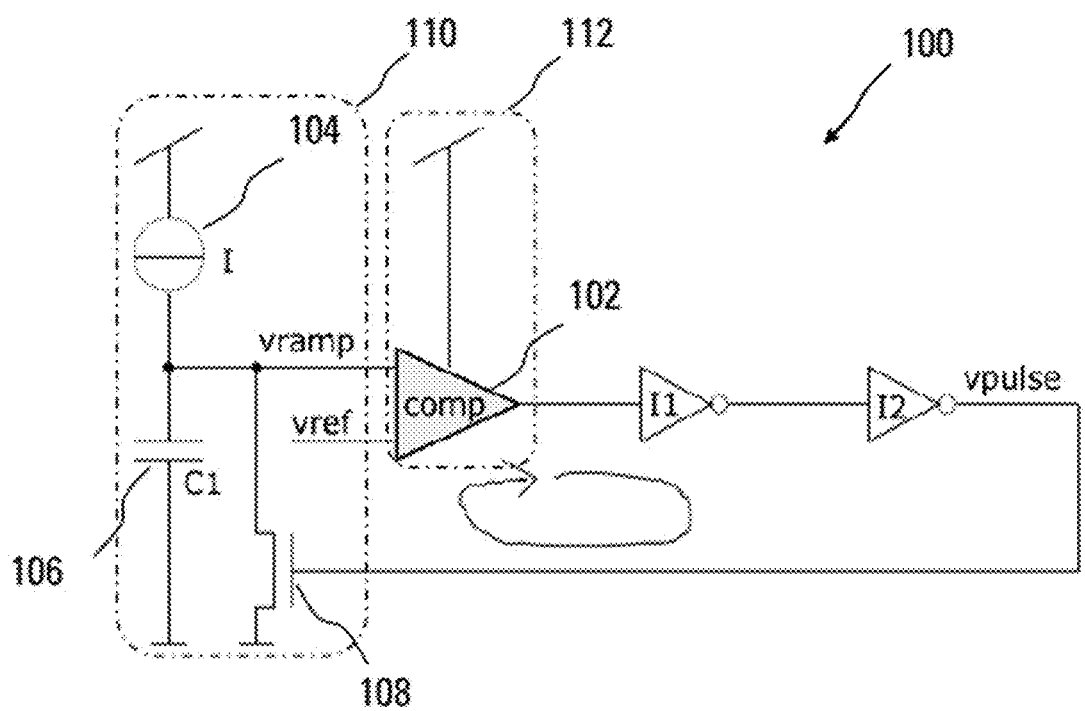
FIG. 1A shows a schematic illustration of a timer circuit in accordance with prior art.

In the following detailed description, reference is made to the accompanying drawings, which form part of this description and show for elucidation purposes specific embodiments in which the disclosed subject matter can be implemented. In this regard, direction terminology such as, for instance, "at the top", "at the bottom", "at the front", "at the back", "front", "rear" etc. is used with respect to the orientation of the figure(s) described. Since components of embodiments can be positioned in a number of different orientations, the direction terminology serves for elucidation and is not restrictive in any way whatsoever. It goes without saying that other embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

In various exemplary embodiments, a timer circuit is provided in which a dead time of a ramp voltage generator is reduced by a voltage pulse being generated, the length (time duration) of which is predefined only (or substantially only) by the time duration that is required to discharge a (e.g. first) capacitor of the timer circuit.

In order to generate a voltage pulse having the predefined time duration, an additional voltage pulse generator circuit can be provided as part of the timer circuit.

The voltage pulse generator circuit can comprise a second capacitor, for example, which can be substantially a copy of the first capacitor (e.g. of the same type), such that the first capacitor and the second capacitor have identical or substantially identical charging/discharging properties.

A certain safety range which ensures that the time duration of the voltage pulse utilized as reset signal is definitely long enough to ensure complete discharging of the first capacitor can be provided in the case of the voltage pulse generator circuit. By way of example, during a discharge process that defines the time duration, the second capacitor can be discharged by means of a weaker discharge transistor than the first capacitor, and/or before the discharge process, the second capacitor may have been charged with a higher voltage, for example with a supply voltage, which is higher than a switching threshold up to which the first capacitor can be charged.

In various exemplary embodiments, a reset time duration of the comparator may be substantially irrelevant because the comparator is utilized only for defining the start of a reset signal, and an end of the reset signal is defined independently of the comparator, for example by means of the voltage pulse generator circuit. The comparator can thus be given enough time for resetting, for example while a charging cycle of the (first) capacitor for the subsequent time period is already started.

Optionally, in various exemplary embodiments, the resetting of the comparator can be actively accelerated, for example by the voltage pulse that is provided as reset signal for the (first) capacitor additionally being provided as reset signal for the comparator.

Since reset properties of the comparator in accordance with various exemplary embodiments are substantially irrelevant to the time base generated, i.e. a short reset time is not a relevant design goal for the comparator, the possibility of optimizing the comparator in regard to a short turn-on time is provided.

In the case of the timer circuit in accordance with various exemplary embodiments, a process-dependent variation of the time base generated is reduced and more easily definable and stabler parameters such as the capacitance of the capacitor and the charging current with which the capacitor is charged (or a resistance via which the capacitor is charged with the charging current) substantially define the length of the time base (the clock cycle or the period or the corresponding frequency).

Figure 2A:
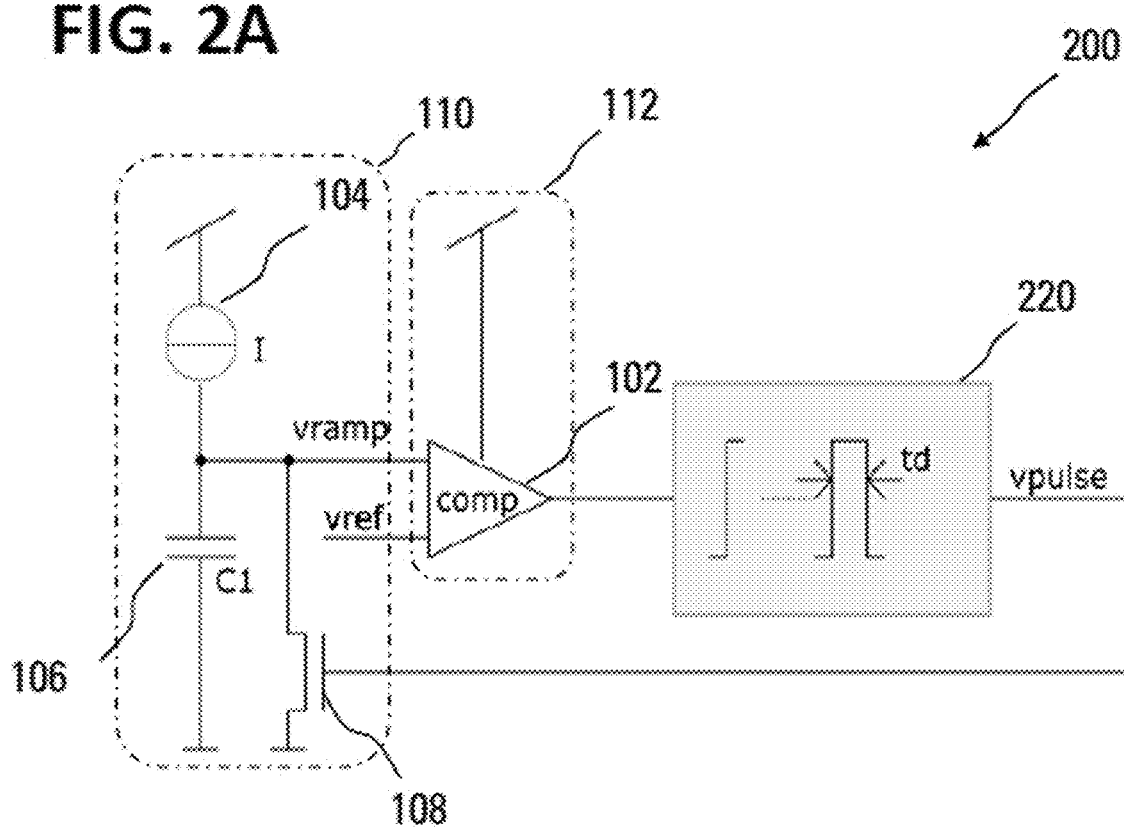
FIG. 2A shows a schematic illustration of a timer circuit in accordance with various exemplary embodiments.
Figure 2B:
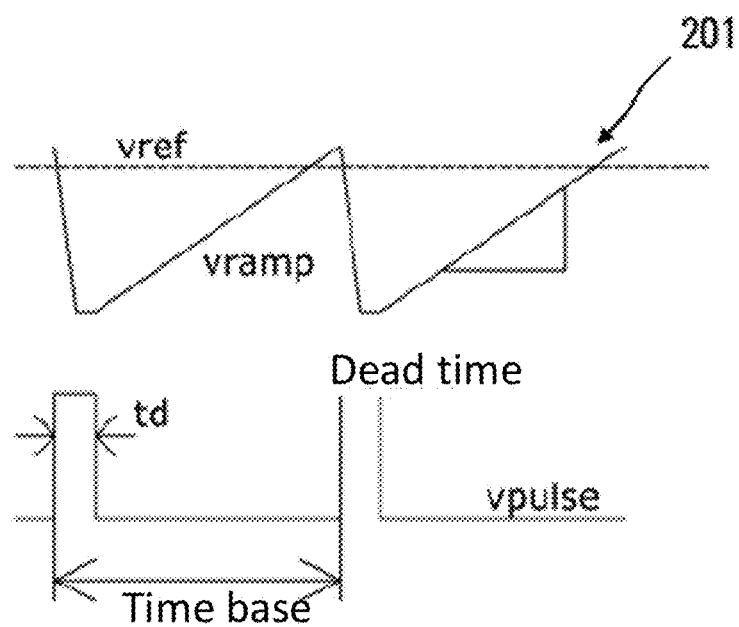
FIG. 2B shows an elucidation of a temporal profile of voltage signals in the timer circuit from FIG. 2A.
Figure 3A:
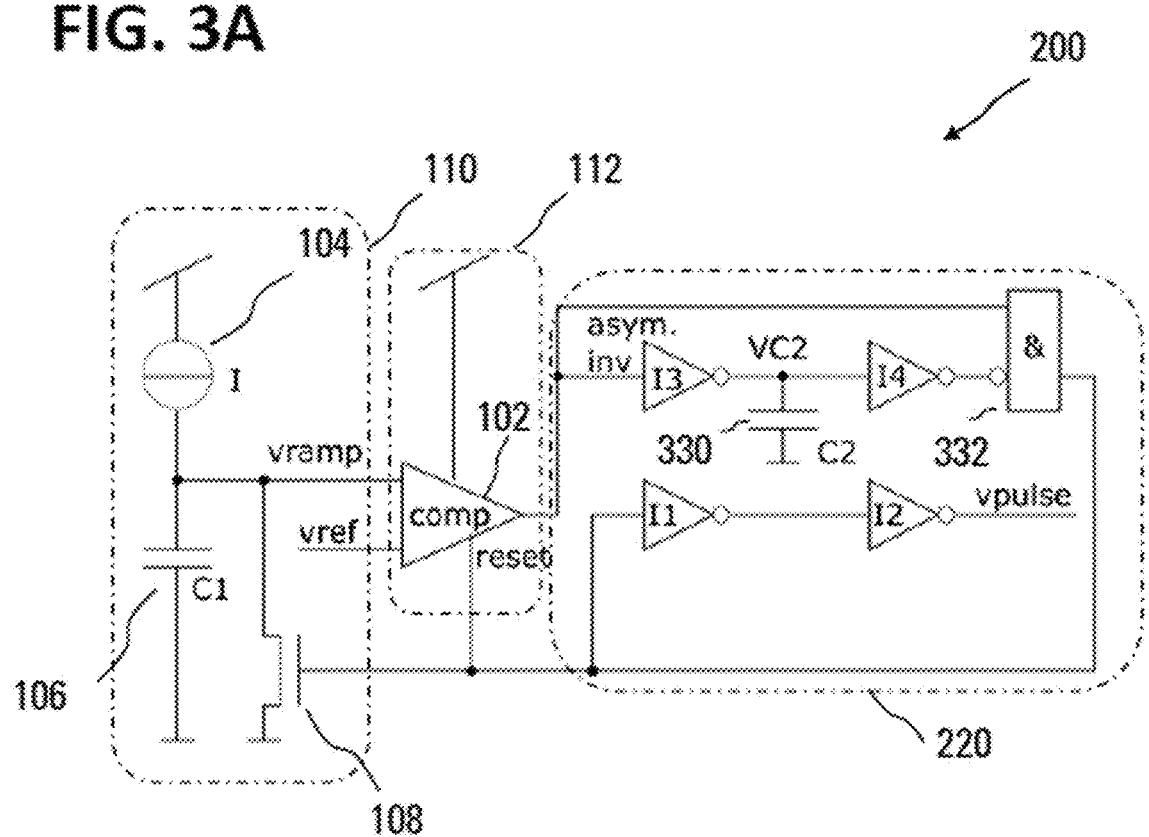
FIG. 3A shows a schematic illustration of a timer circuit in accordance with various exemplary embodiments.
Figure 3B:
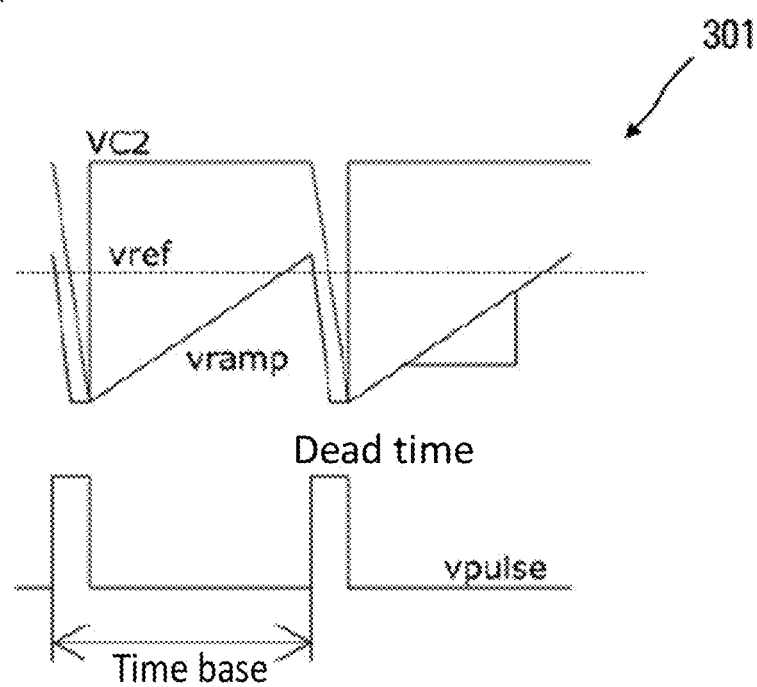
FIG. 3B shows an elucidation of a temporal profile of voltage signals in the timer circuit from FIG. 3A.

FIG. 2A shows a schematic illustration of a timer circuit 200 in accordance with various exemplary embodiments. FIG. 2B shows an elucidation 201 of a temporal profile of voltage signals in the timer circuit from FIG. 2A. FIG. 3A shows a schematic illustration of a timer circuit 200 in accordance with various exemplary embodiments. And FIG. 3B shows an elucidation 301 of a temporal profile of voltage signals in the timer circuit from FIG. 3A.

In various exemplary embodiments, the timer circuit 200 comprises a ramp voltage generator 110 configured to generate a ramp voltage vramp.

The ramp voltage generator 110 can be formed substantially as known in the prior art, for example in a manner similar or exactly the same as that described in association with the timer circuit 100.

The ramp voltage generator 110 can be configured to generate a ramp voltage vramp rising in ramplike fashion, for example by means of the charging of a (first) capacitor 106 (also designated by C1 in FIGS. 2A and 3A) by means of a constant-current source 104.

The timer circuit 200 can furthermore comprise a comparator 102, which can be coupled to the ramp voltage generator 110 on the input side (e.g. at a first input) for the purpose of receiving the ramp voltage vramp, and can furthermore have a switching threshold.

The comparator 102 can be configured to compare the received ramp voltage vramp with the switching threshold.

Generally, the switching threshold can be configured for example as a reference voltage provided at a second input, as an inverter (e.g. with approximately ½ VDD) or as a Schmitt trigger.

In the exemplary embodiments illustrated by way of example in FIG. 2A and FIG. 3A, a reference voltage vref is provided at the second input. Even though hereinafter, with reference to the exemplary embodiments, an explanation is given of how the reference voltage vref is utilized by the comparator 102, it should be understood that, instead of the reference voltage vref, the switching threshold can be provided in some other way, for example as explained above.

The comparator 102 can be configured to provide an output signal if it ascertains that the value of the ramp voltage vramp has reached the value of the reference voltage vref. The output signal can be configured to initiate generation of a reset signal vpulse, which is fed to the ramp voltage generator 110 in order to end the charging of the capacitor 106 and to reset the capacitor 106.

The timer circuit 200 can furthermore comprise a voltage pulse generating circuit 220 configured to generate the reset signal vpulse as a response to the received output signal of the comparator 102.

In FIGS. 2B and 3B, the entire voltage profile provided at the output of the voltage pulse generating circuit 220 is designated by "vpulse". It should be understood, however, that the reset signal vpulse is deemed to be generated or provided at the output of the voltage pulse generating circuit 220 only if the output voltage has the voltage value necessary for discharging the first capacitor 106, a high positive voltage value (corresponding to a logic one) in the exemplary embodiments shown in FIG. 2B and FIG. 3B.

Figure 1B:
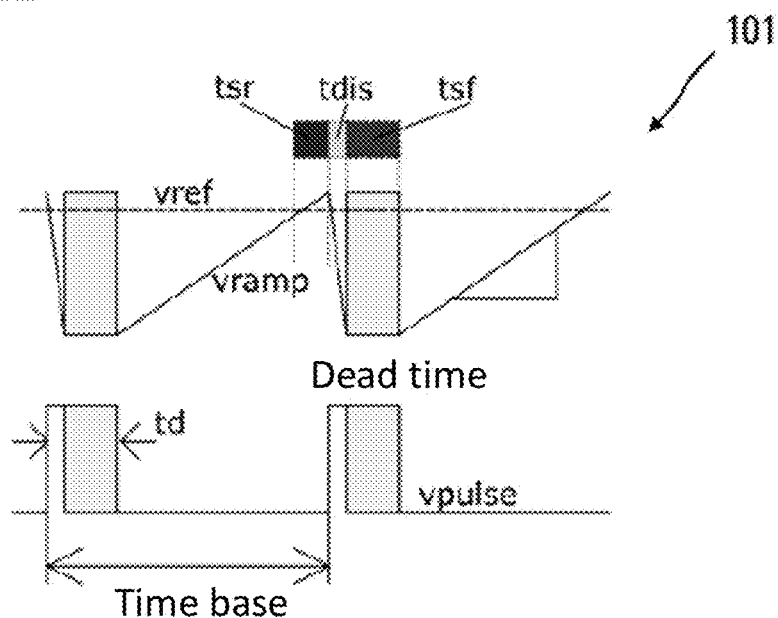
FIG. 1B shows an elucidation of a temporal profile of voltage signals in the timer circuit from FIG. 1A.

The reset signal vpulse has a shorter time duration than an intrinsic reset time duration of the comparator 102. That is elucidated in the comparison between FIG. 1B, which shows the prior art, and FIG. 2B and FIG. 3B, which show temporal profiles of voltage signals in timer circuits 200 in accordance with various exemplary embodiments. The intrinsic reset time duration is designated by tsf in FIGS. 1B and 1s caused by discharge processes, etc. in the comparator 102.

In the case of the timer circuits 200 in accordance with various exemplary embodiments, the dead time td is shortened in comparison with the prior art because there is no need to wait for the comparator 110 to be reset, since an end of the reset signal vpulse is brought about independently by the voltage pulse generating circuit 220, without the comparator 110 being required for this, said comparator only defining the start of the reset signal vpulse.

Accordingly, the ramp voltage generator 110 can begin a new time base or period or a new clock cycle practically immediately after the complete discharge of the (first) capacitor 106 by virtue of the (first) capacitor 106 being charged once again. Part of the dead time td may be the lower plateau phase illustrated in FIG. 2B and FIG. 3D. Said phase can correspond to a safety range which can be provided to ensure that the (first) capacitor 106 is completely discharged.

The length of the time duration in which the reset signal vpulse is provided by the voltage pulse generating circuit 220, and thus the time duration which is provided to the (first) capacitor 106 for discharging purposes, can be defined by means of the voltage pulse generating circuit 220.

In various exemplary embodiments, a (second) capacitor 330 can be provided for the purpose of defining the time duration in the voltage pulse generating circuit 220. A corresponding timer circuit 200 is illustrated in FIG. 3A.

The second capacitor 330 can be for example substantially a copy of the first capacitor 106, for example having a similar or identical capacitance and/or connected to similar or identical discharge transistors (e.g. the inverter 13 acting as a discharge transistor for the second capacitor 330 can be designed identically or similarly to a transistor 108 via which the first capacitor 106 is discharged), such that the first capacitor 106 and the second capacitor 330 have identical or substantially identical charging/discharging properties.

A certain safety range (illustrated as the lower plateau within the dead time td in FIG. 2B and FIG. 3B) which ensures that the time duration of the voltage pulse utilized as reset signal vpulse is definitely long enough to ensure the complete discharge of the first capacitor 106 can be provided by means of the voltage pulse generator circuit 220.

By way of example, the transistor (the inverter 13) defining the time duration of the discharge process of the second capacitor 330 can be designed more weakly than the transistor 108 for the discharge of the first capacitor 106, and/or before the discharge process, the second capacitor 330 may have been charged with a higher voltage, for example with a supply voltage which is higher (e.g. can be typically in a range of approximately 1 V) than a reference voltage (typically in the millivolts range) with which the first capacitor 106 can be charged. Accordingly, a discharge process of the second capacitor 330 can have a duration slightly longer than the discharge duration of the first capacitor 106, and the time duration of the reset signal vpulse that is defined by the discharge duration of the second capacitor 330 can thus be slightly longer than the discharge duration of the first capacitor 106.

In various exemplary embodiments, the voltage pulse generating circuit 220 can furthermore comprise a logic gate 332 having a first input, a second input and an output.

The voltage pulse generating circuit 220 can be configured to feed a signal corresponding to the output signal of the comparator 102 to the first input, which defines a start of the reset signal vpulse. In the exemplary timer circuit 200 from FIG. 3A, the output of the comparator 102 is electrically conductively connected directly to the first input of the logic gate 332.

The voltage pulse generating circuit 220 can furthermore be configured likewise to feed a signal corresponding to the output signal of the comparator 102 to the second input of the logic gate 332. However, the signal fed to the second input can have a time delay in comparison with the signal fed to the first input.

The signal fed to the second input can define an end of the reset signal vpulse. Accordingly, the time delay between the signal provided at the first input and the signal provided at the second input can define the time duration of the reset signal vpulse provided by the voltage pulse generating circuit 220.

In various exemplary embodiments, the logic gate 332 can be an AND gate. In this case, the signal corresponding to the output signal of the comparator and provided at the second input with a time delay can be an inverted signal with respect to the output signal of the comparator.

Accordingly, in a charging phase of the first capacitor 106 before reaching the reference voltage, a logic zero can be present at the output of the comparator. Said logic zero is also present directly at the first input. A logic one is present at the second input owing to the inverted signal. In FIG. 3B that corresponds to a phase in which the voltage at the second capacitor 330 (node VC2) has its maximum value. Accordingly (at least one zero at the inputs), the AND gate outputs a logic zero at its output.

As soon as the ramp voltage vramp reaches the reference value vref (or with a slight delay owing to the inertia of the comparator 102), a logic one is provided at the output of the comparator 102. Said logic one is present practically immediately at the first input of the AND gate 332 as well. Consequently, a one is present at both inputs of the AND gate 332. Accordingly, a logic one (and thus the reset signal vpulse) is likewise provided at the output of the AND gate 332.

As soon as the second capacitor 330 is discharged, with a time delay the comparator output signal (which is inverted in this case, i.e. a logic zero instead of the logic one present at the comparator output) is also provided to the second input of the AND gate 332. To put it another way, the logic one present there is switched over to a logic zero with a time delay. Thus, two different values are present again at the inputs of the AND gate 332, and the output of the AND gate 332 is switched back to logic zero (e.g. low voltage, e.g. zero volts). The provision of the reset signal vpulse is thus ended.

In various exemplary embodiments, it is possible to choose other designs in which the voltage pulse generating circuit 220 is configured, proceeding from the signal output by the comparator 102 to provide a reset signal adapted to the discharge duration of the first capacitor 106.

At least in the low-energy range, the discharge duration of the first capacitor 106 is typically significantly shorter than an intrinsic reset time duration of the comparator 102, and so even when the safety range is provided, the time duration of the reset signal is shorter than the intrinsic reset time duration of the comparator 102.

Optionally, in various exemplary embodiments (see FIG. 3A, connecting line to the comparator 102 that is designated by "reset", the comparator 102 can be reset by means of the reset signal vpulse.

Some exemplary embodiments are specified in summary below.

Exemplary embodiment 1 is a timer circuit. The timer circuit comprises a ramp voltage generator configured to generate a ramp voltage, a comparator coupled to the ramp voltage generator on the input side for the purpose of receiving the ramp voltage and configured for comparing the ramp voltage with a switching threshold, and a voltage pulse generating circuit configured to generate a reset signal as a response to a received output signal of the comparator, wherein the reset signal has a shorter time duration than an intrinsic reset time duration of the comparator.

Exemplary embodiment 2 is a timer circuit in accordance with exemplary embodiment 1, wherein the ramp voltage generator is furthermore configured for receiving the reset signal.

Exemplary embodiment 3 is a timer circuit in accordance with exemplary embodiment 2, wherein the ramp voltage generator is furthermore configured for resetting the ramp voltage generator as a response to receiving the reset signal.

Exemplary embodiment 4 is a timer circuit in accordance with exemplary embodiment 3, wherein the ramp voltage generator comprises a first capacitor and the resetting comprises discharging the first capacitor.

Exemplary embodiment 5 is a timer circuit in accordance with exemplary embodiment 4, wherein the time duration of the reset signal is at least as long as a discharge duration of the first capacitor.

Exemplary embodiment 6 is a timer circuit in accordance with exemplary embodiment 4 or 5, wherein the ramp voltage generator comprises a transistor, and wherein the reset signal is configured to switch the transistor for the purpose of discharging the first capacitor.

Exemplary embodiment 7 is a timer circuit in accordance with any of exemplary embodiments 1 to 6, wherein the comparator is furthermore configured for receiving the reset signal and for resetting the comparator as a response to receiving the reset signal.

Exemplary embodiment 8 is a timer circuit in accordance with any of exemplary embodiments 1 to 7, wherein the voltage pulse generating circuit comprises a logic gate having a first input, a second input and an output, wherein the voltage pulse generating circuit is configured to feed a signal corresponding to the output signal of the comparator to the first input, which defines a start of the reset signal, and to feed a signal corresponding to the output signal of the comparator to the second input with a time delay, which defines an end of the reset signal.

Exemplary embodiment 9 is a timer circuit in accordance with exemplary embodiment 8, wherein the logic gate is an AND gate, and wherein the signal corresponding to the output signal of the comparator and provided at the second input with a time delay is an inverted signal with respect to the output signal of the comparator.

Exemplary embodiment 10 is a timer circuit in accordance with any of exemplary embodiments 1 to 9, wherein the voltage pulse generating circuit comprises a second capacitor.

Exemplary embodiment 11 is a timer circuit in accordance with exemplary embodiment 10, wherein the second capacitor is configured to set the time duration of the voltage pulse such that it is at least as long as a discharge duration of the first capacitor.

Exemplary embodiment 12 is a timer circuit in accordance with either of exemplary embodiments 10 and 11, wherein a voltage difference between a state of charge and a state of discharge is greater for the second capacitor than for the first capacitor.

Exemplary embodiment 13 is a timer circuit in accordance with any of exemplary embodiments 1 to 12, wherein the switching threshold is formed by means of a reference voltage, a Schmitt trigger or an inverter.

Further advantageous embodiments of the device are evident from the description of the method, and vice versa.

The invention claimed is:

1. A timer circuit, comprising:
   a ramp voltage generator configured to generate a ramp voltage;
   a comparator coupled on its input side to the ramp voltage generator to receive the ramp voltage and configured to compare the ramp voltage with a switching threshold; and
   a voltage pulse generating circuit configured to generate a reset signal as a response to a received output signal of the comparator, wherein the reset signal has a shorter time duration than an intrinsic reset time duration of the comparator,
   wherein the comparator is further configured to receive the reset signal and to reset the comparator as a response to receiving the reset signal.

2. The timer circuit as claimed in claim 1,
   wherein the ramp voltage generator is furthermore configured to receive the reset signal.

3. The timer circuit as claimed in claim 2,
   wherein the ramp voltage generator is furthermore configured to reset the ramp voltage generator as a response to receiving the reset signal.

4. The timer circuit as claimed in claim 3,
   wherein the ramp voltage generator comprises a first capacitor and the resetting comprises discharging the first capacitor.

5. A timer circuit, comprising:
   a ramp voltage generator configured to generate a ramp voltage;
   a comparator coupled on its input side to the ramp voltage generator to receive the ramp voltage and configured to compare the ramp voltage with a switching threshold; and
   a voltage pulse generating circuit configured to generate a reset signal as a response to a received output signal of the comparator, wherein the reset signal has a shorter time duration than an intrinsic reset time duration of the comparator,
   wherein the ramp voltage generator is further configured to receive the reset signal, and reset the ramp voltage generator as a response to receiving the reset signal,
   wherein the ramp voltage generator comprises a first capacitor and the resetting comprises discharging the first capacitor, and
   wherein the time duration of the reset signal is at least as long as a discharge duration of the first capacitor.

6. The timer circuit as claimed in claim 4,
   wherein the ramp voltage generator comprises a transistor; and
   wherein the reset signal is configured to switch the transistor to discharge the first capacitor.

7. A timer circuit, comprising:
   a ramp voltage generator configured to generate a ramp voltage;
   a comparator coupled on its input side to the ramp voltage generator to receive the ramp voltage and configured to compare the ramp voltage with a switching threshold; and
   a voltage pulse generating circuit configured to generate a reset signal as a response to a received output signal of the comparator, wherein the reset signal has a shorter time duration than an intrinsic reset time duration of the comparator,
   wherein the voltage pulse generating circuit comprises a logic gate having a first input, a second input, and an output, and the voltage pulse generating circuit is configured to feed a signal corresponding to the output signal of the comparator to the first input, which defines a start of the reset signal, and to feed a signal corresponding to the output signal of the comparator to the second input with a time delay, which defines an end of the reset signal, wherein the logic gate is an AND gate, and
   wherein the signal corresponding to the output signal of the comparator and provided at the second input with a time delay is an inverted signal with respect to the output signal of the comparator.

8. The timer circuit as claimed in claim 4,
   wherein the voltage pulse generating circuit comprises a second capacitor.

9. The timer circuit as claimed in claim 8,
   wherein the second capacitor is configured to set the time duration of the voltage pulse such that it is at least as long as a discharge duration of the first capacitor.

10. The timer circuit as claimed in claim 8, wherein a voltage difference between a state of charge and a state of discharge is greater for the second capacitor than for the first capacitor.

11. The timer circuit as claimed in claim 1, wherein the switching threshold is formed by a reference voltage, a Schmitt trigger, or an inverter.

* * * * *